United States Patent [19]
DeGuiseppi

[11] Patent Number: 5,522,769
[45] Date of Patent: Jun. 4, 1996

[54] GAS-PERMEABLE, LIQUID-IMPERMEABLE VENT COVER

[75] Inventor: David T. DeGuiseppi, Chadds Ford, Pa.

[73] Assignee: W. L. Gore & Associates, Inc., Newark, Del.

[21] Appl. No.: 340,912

[22] Filed: Nov. 17, 1994

[51] Int. Cl.$^6$ .................................................. B01D 19/00
[52] U.S. Cl. .................................. 454/270; 96/6; 454/274
[58] Field of Search ..................... 95/46; 96/6; 454/254, 454/270, 271, 274, 275, 276, 370

[56] References Cited

U.S. PATENT DOCUMENTS

| | | | |
|---|---|---|---|
| 3,159,090 | 12/1964 | Schutt | 454/270 |
| 4,237,526 | 12/1980 | Wood | 362/158 |
| 4,238,207 | 12/1980 | Ruschke | 96/6 |
| 4,825,905 | 5/1989 | Whitley, II | 137/587 |
| 4,921,124 | 5/1990 | Stammler et al. | 220/367 |
| 4,974,745 | 12/1990 | Jocham | 220/371 |
| 5,080,001 | 1/1992 | Ishibashi et al. | 454/370 |
| 5,125,428 | 6/1992 | Rauter | 137/199 |
| 5,215,312 | 6/1993 | Knappe et al. | 277/1 |
| 5,348,570 | 9/1994 | Ruppert, Jr. et al. | 96/6 |

FOREIGN PATENT DOCUMENTS

| | | |
|---|---|---|
| 8707254 | 11/1988 | Germany . |
| 3923530 | 1/1990 | Germany . |

OTHER PUBLICATIONS

Patent Abstract of Japan—vol. 10, No. 273, M–518, abstract of JP, A, 61–96274 (Sumitomo Electric Ind., Ltd.) 14 May 1986 (14.May.1986).

Primary Examiner—Harold Joyce
Attorney, Agent, or Firm—Gary A. Samuels

[57] ABSTRACT

A flexible, insertable vent cover is formed from a flexible, resilient material. The cover has a through passageway; a gas-permeable, liquid-impermeable membrane traversing the passageway; a diaphragm valve covering the membrane; and an annular securing ring that maintains the valve in a protective position with respect to the membrane in order to protect the membrane from immersion in or impingement by liquid.

8 Claims, 3 Drawing Sheets

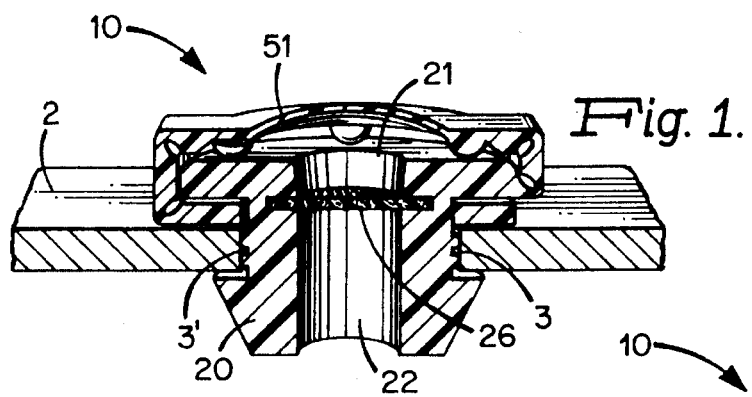
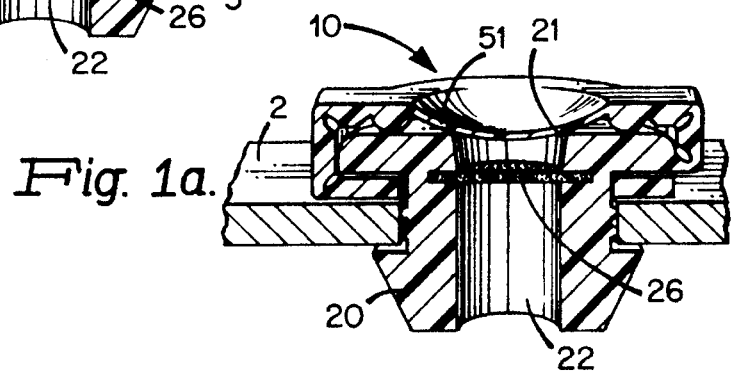
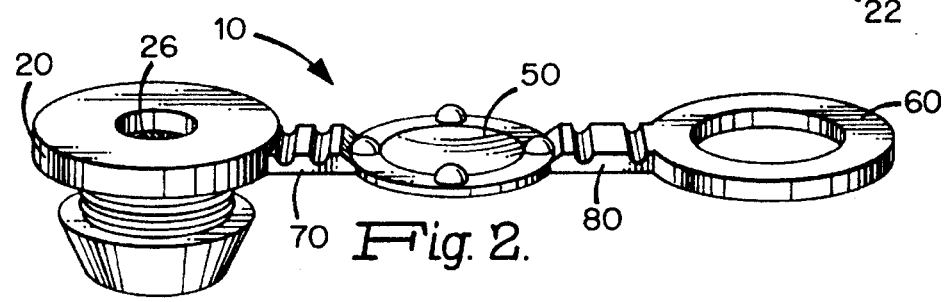
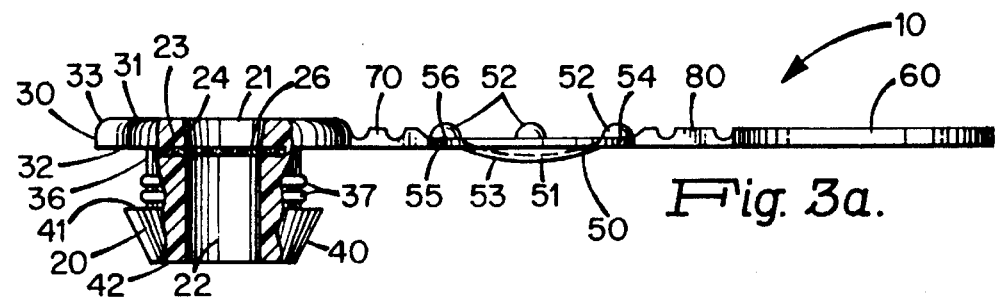
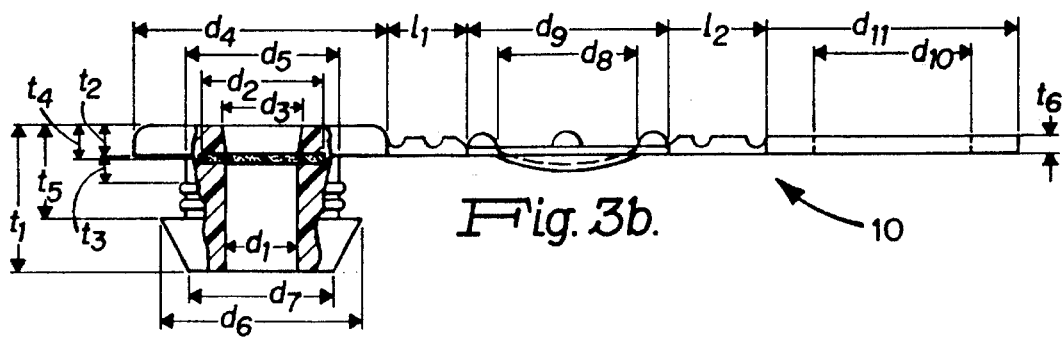

ns3,522,769

GAS-PERMEABLE, LIQUID-IMPERMEABLE VENT COVER

FIELD OF THE INVENTION

The present invention relates to an air pressure equalizing vent cover. More specifically, the present invention relates to a one piece vent cover that contains a polytetrafluoroethylene membrane for gaseous transfer and liquid exclusion and which retains its integrity when immersed or directly impinged by liquids.

BACKGROUND OF THE INVENTION

Gas-permeable, liquid-impermeable vents find use in many applications in the automotive industry, such as, electrical component housings, gear housings, vehicle bodies, brake housings, etc. where pressure equalization between the housing interior and surrounding environment must occur. These gas pressure equalizing vents can also be used in electrical equipment housings. While vents must allow for gas pressure equalization, they must also seal the interior of the housings from moisture and/or liquids. Failure to exclude moisture and liquids, such as water, can damage the components and corrode the housing.

For example, in German Utility Patent G8707254.8, a gas-permeable, water-impermeable venting assembly for equalizing pressure has been used in a housing that mounts a drive mechanism for a car window or sliding roof. The housing includes a stepped bore with a shoulder for supporting the element that is formed from three separate components. The three component venting assembly includes a membrane juxtaposed against the shoulder of the bore and is maintained in sealing engagement by a sealing ring and spring lock washer. The assembly requires separate insertion of each component. Moreover, the degree of sealing is not fully satisfactory and does not protect the membrane surface from contaminating liquids and grease. Also, because the membrane surface is unprotected, damage from impinging and immersing liquids can occur.

An equalizing element formed from a resilient ring having a polytetrafluoroethylene membrane is described in U.S. Pat. No. 5,215,512. The resilient ring is outwardly flared and retained in a shouldered bore of smaller diameter within a gear housing wall. The element is maintained in position by the outward pressure exerted by the outwardly flared ring against the wall of the bore. A polytetrafluoroethylene membrane extends across the open center section of the element. Struts extend across the top of the element and membrane in a spaced apart arrangement. The struts provide minimal protection to the membrane surface because only a small portion of the membrane is covered by the struts. As a result, a majority of the membrane surface is exposed to the surrounding environment. Moreover, the spacing of the struts from the surface of the membrane does not prevent water, dirt, oil or other contaminating fluids from seeping into the space between the membrane and the struts.

Press fitted articles containing a molded body and a porous membrane formed from polytetrafluoroethylene (PTFE), polypropylene or polyethylene are also known and can be used as an air vent device in a breather valve, a filter, a diaphragm device, etc. The press fitted article includes an interiorly positioned member having a membrane with circumferentially located holes that are positioned between rigid resin portions bound together through the circumferentially located holes. This rigid member is encompassed by a soft resin to form the press fitted article. The resulting article may have a circumferentially located groove.

Air pressure equalizing elements are also known and used to compensate for pressure changes due to temperature differences between the air with a housing and the surrounding environment. One such device is a thimble shaped pressure equalizing element for electrical equipment. The side walls of the element are formed from PTFE. Another such device uses an air-transmissive foil of PTFE that is sandwiched under tension between supporting elements. This device includes a perforated cover.

Although these prior art devices provide for air pressure equalization by using a gas-permeable, liquid-impermeable membrane, they are susceptible to contaminating materials such as oils, greases, organic liquids, as well as dirt. In addition, liquid immersion conditions or direct impingement by liquids frequently damages the membrane in the element and prevent its normal operation. Thus, a need exists for a vent that, in addition to providing for air pressure equalization via a vapor-permeable, liquid impermeable membrane, is also capable of maintaining its integrity under more adverse conditions that occur from immersion, direct impingement or contact with contaminating liquids and dirt. The above disadvantages and problems have been overcome by the present invention described below.

SUMMARY OF THE INVENTION

In accordance with the present invention, a one piece, molded vent cover having a polytetrafluoroethylene membrane and a diaphragm protecting valve that permits air pressure equalization of a housing, is provided.

The membrane allows gases such as in air, to escape from the housing and prevents liquids from entering the housing with the aid of the diaphragm valve. The diaphragm valve covers at least the cross-sectional flow area of the membrane. The diaphragm valve allows gas vented from the housing to escape through the membrane to the surrounding environment and prevents immersion in or impingement by liquids, such as water, or contaminating materials.

Therefore, an object of the present invention is to provide an insertable vent cover that maintains its integrity when contacted by liquids and contaminating materials.

A further object of the present invention is to provide a one-piece molded vent cover that maintains its integrity under adverse conditions.

Another object of the present invention is to provide a polytetrafluoroethylene-containing vent cover that is protected by a diaphragm valve.

A further object of the present invention is to protect a vent cover against damage from immersing or directly impinging liquids.

These and other objects and advantages will become evident from a review of the following description when considered in conjunction with the accompanying drawings.

BRIEF DESCRIPTION OF THE DRAWINGS

FIG. 1 shows the vent cover of the present invention with the diaphragm valve 50 shown in the open, or convex, position. FIG. 1a shows the vent cover with the diaphragm valve in the closed, or concave, position.

FIG. 2 shows a perspective view of the vent cover of the present invention in a preassembled stage.

FIGS. 3(a) and 3(b) show side views of the preassembled stage of the vent cover of FIG. 2.

DETAILED DESCRIPTION OF THE INVENTION

Figure 3C:
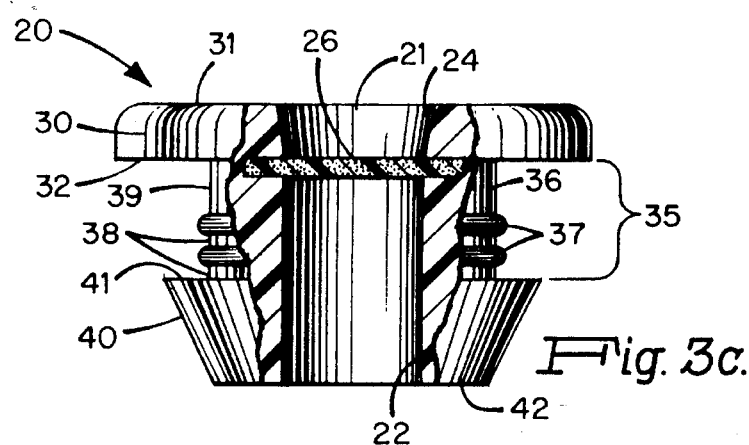
FIGS. 3(c) shows an expanded side view of the main body of the preassembled vent cover of FIG. 2.
Figure 4:
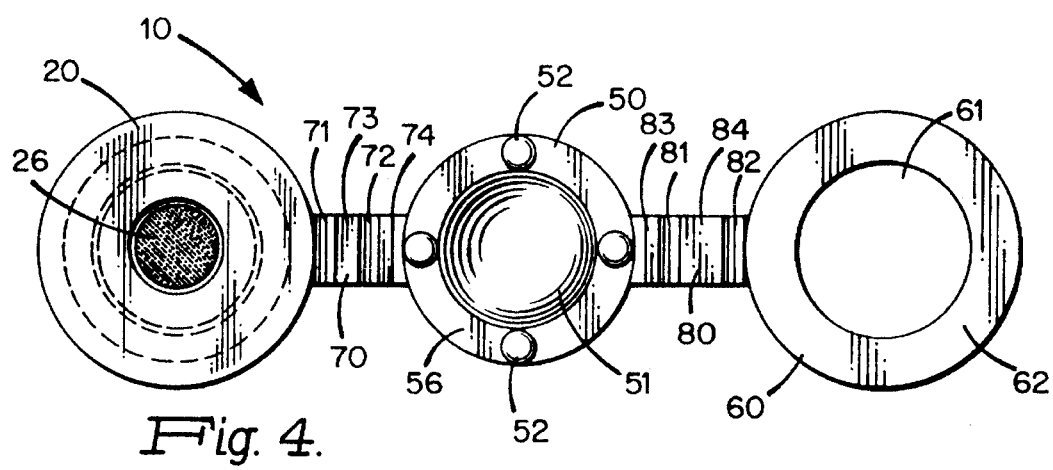
FIG. 4 shows a top view of the preassembled vent cover of FIG. 2.
Figure 5:
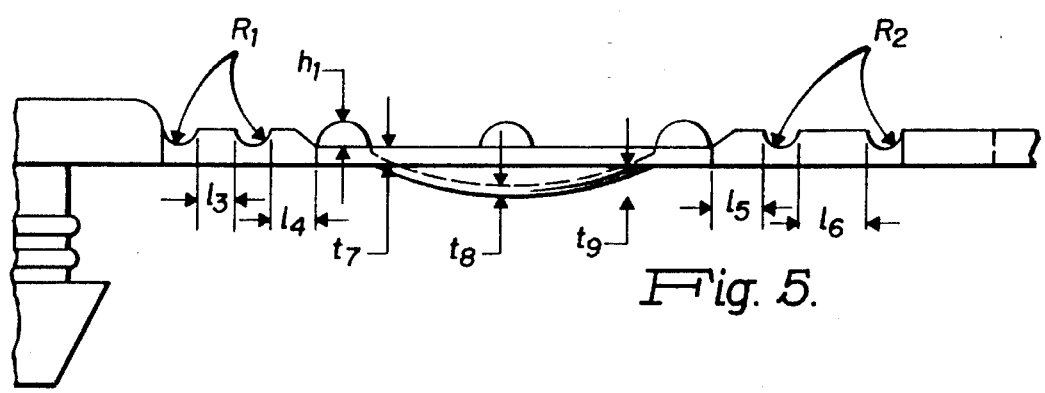
FIG. 5 shows an expanded view of the valve and securing ring with connectors of the vent cover of FIG. 2.

As shown in FIG. 1, the housing to be vented includes a wall 2 that has an opening or port between 3 and 3' that receives the vent cover (e.g., a plug or insert) 10. The vent cover 10 shown in FIG. 1 will now be described with reference to FIGS. 2–5. With respect to FIGS. 2–4, the vent cover 10 is formed from a single piece of flexible resilient polymeric material, with the exception of the gas-permeable, liquid impermeable membrane. The polymeric material can be a silicone, rubber, a thermoplastic elastomer such as SANTOPRENE® elastomer, or other suitable material. When assembled, as shown in FIG. 1, the vent cover can be press fitted into port 3. The vent cover can be prepared by molding the polymer material or by other techniques known to those skilled in the art. As a result, the vent cover can be of a one piece construction. Although the preferred vent cover is designed to be press fitted, it can be designed to be screw fitted, as well. It is necessary that the vent cover be retained in a tight sealing manner within the housing wall to require the gas to be vented from the housing by only passing through the membrane, and to seal the housing interior from liquids.

The vent cover 10 has a main body 20, a diaphragm valve 50, a securing ring or member 60 and connector tabs 70 and 80. The main body 20 is connected to valve 50 by tab 70 and the valve 50 is connected to securing ring 60 by tab 80.

Vent cover 10 contains a gas-permeable, liquid impermeable membrane 26 which is preferably formed from polytetrafluoroethylene, prepared in accordance with U.S. Pat. No. 3,953,566 to Gore. The membrane 26 is positioned approximately the distance $t_4$ from surface 31 of main body 20.

As seen in FIGS. 3(a)–3(c) and 4, the main body 20 has a thickness $t_1$ with a through passageway 21 containing transversely mounted gas-permeable, liquid impermeable membrane 26, a top 30 with a thickness $t_2$, a center ribbed portion 35 and a tapered lower end 40.

The passageway 21 preferably has a longitudinal section 22 of constant diameter $d_1$, an outwardly extending annular channel 23 of diameter $d_2$ for receiving the membrane 26, and a diverging section 24 having a tapered lower end with a diameter $d_1$ and an upper larger diameter $d_3$. Diameters $d_1$ and $d_3$ may also be the same. The diameters of sections 22 and 24 are selected to provide for the annular channel 23 and maintain the membrane 26 in position. Thus, sections 22 and 24 may independently be of constant diameter or flared to provide the necessary egress of gas from the housing 1.

The main body 20 has a top 30 with an outer diameter $d_4$ that extends outwardly from the outer surface 36 of center portion 35. The top 30 includes upper surface 31, a lower surface 32 and a curved upper edge 33. Center portion 35 has an outer diameter $d_5$ with a plurality of circumferentially located, radially outwardly extending, spaced apart ribs 37. The ribs 37 are also spaced from the lower surface 32 of the top 30 and the upper surface 41 of the tapered end 40. The distances between upper surface 31 and the bottom surface 42 is $t_1$ and surfaces 31 and 41 is $t_5$. The spacing between surface 32 and the uppermost rib 37 is $t_3$. The spaced apart ribs and respective upper and lower surfaces 32 and 41 form a plurality of grooves 38 and 39. The inner diameter of grooves 38 and 39, $d_5$, is less than the outer diameter of the ribs 37. The uppermost groove 39 has a diameter $d_5$ and a length of $t_3$ that is sufficient to resiliently and sealingly engage the securing ring 60.

The main body 20 includes a tapered end 40 that has an upper outer diameter $d_6$ and a lower outer diameter $d_7$, where $d_7$ is less than $d_6$. Diameter $d_7$ is also less than the diameter of port 3 in the housing wall 2.

The diaphragm valve 50 is best shown in FIGS. 3(a), 3(b), 4 and 5 and includes an outwardly extending, convex or dome shaped diaphragm 51 of diameter $d_8$, although other shapes and designs are possible. The valve 50 provides protection to the membrane under normal and adverse conditions. Adverse conditions include situations where the vent cover is immersed in liquids such as water or where liquids directly impinge the membrane surface. An example is oil that is accidentally spilled onto a housing containing the vent cover.

Valve 50 contains a peripherally located annular ring or rim 54 having a thickness of $t_7$, an inner diameter $d_8$ and outer diameter $d_9$. Rim 54 preferably has planar surfaces 55 and 56. Surface 56 supports outwardly extending nubs 52. Nubs 52, having a height $h_1$ are shown to be hemispherical in shape, but may be of any shape, size, and number to space the diaphragm valve from the upper surface 31 of main body 20 to allow gas being vented to escape as shown in FIG. 1 where diaphragm valve 51 is depicted in its open, or convex position. On the other hand, when immersed in or impinged by liquid, the presence on the diaphragm valve forces it into a concave position, as shown in FIG. 1a and prevents entry of liquid. The convex diaphragm 51 has a thickness $t_8$ and the outer surface 53 thereof is spaced from surface 54 by a distance $t_9$.

Securing member 60 is annular in shape 62 and has an inner diameter $d_{10}$, an outer diameter $d_{11}$ and forms an opening 61. The thickness of member 60 is $t_6$.

The connecting tab 70 has a thickness $t_6$ and a length $l_1$. Tab 70 is flexible and contains folding grooves 71 and 72, of radius $R_1$ that extend the width of the tab 70. The tab 70 includes planar connecting portions 73 and 74 respectively having of length $l_3$ and $l_4$. Tab 80 has a thickness of $t_6$ and includes folding grooves 81 and 83 interconnected to one another by member 82 and 84 respectively having a length of $l_5$ and $l_6$. The grooves may be linear or preferably have a shape that conforms to the outer shape of the main body, e.g., carved.

The following is a non limiting example of the present invention.

EXAMPLE

A vent cover 10 having a main body 20 is formed from a silicone rubber and includes an expanded, porous PTFE membrane obtained from W. L. Gore & Associates, Inc., having a microporous network of nodes connected by fibrils. The vent cover has the following dimensions:

| | | |
|---|---|---|
| $d_1$ = 4 mm | $d_2$ = 6.73 mm | $d_3$ = 4.4 mm |
| $d_4$ = 13.7 mm | $d_5$ = 8.3 mm | $d_6$ = 11 mm |

-continued

| | | |
|---|---|---|
| $d_7 = 7.8$ mm | $d_8 = 8$ mm | $d_9 = 11$ mm |
| $d_{10} = 8.5$ mm | $d_{11} = 13.7$ mm | |
| $l_1 = 4.3$ mm | $l_2 = 5.3$ m | $l_3 = 1.0$ mm |
| $l_4 = 1.3$ mm | $l_5 = 1.3$ mm | $l_6 = 2.0$ mm |
| $t_1 = 7.9$ mm | $t_2 = 1.5$ mm | $t_3 = 1.5$ mm |
| $t_4 = 1.8$ mm | $t_5 = 4.8$ mm | $t_6 = 1.0$ mm |
| $t_7 = 0.5$ mm | $t_8 = 0.3$ mm | $t_9 = 1.0$ mm |
| $h_1 = 0.75$ mm | $R_1 = 0.5$ | $R_2 = 0.5$ |

Figure 6A:
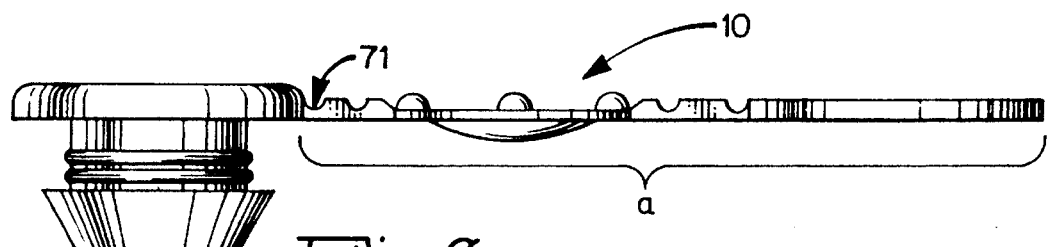
FIGS. 6(a)–6(e) show the assembly steps for forming the vent cover of the present invention.
Figure 6C:
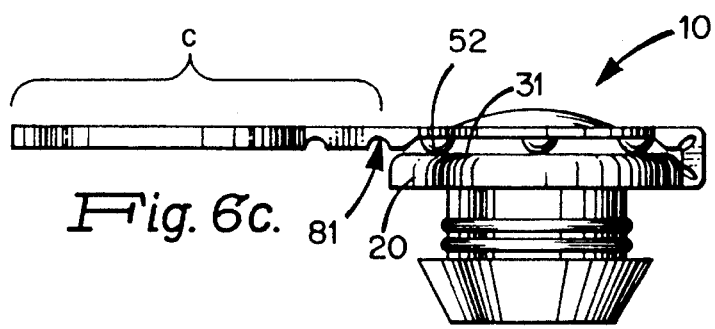
Figure 6B:
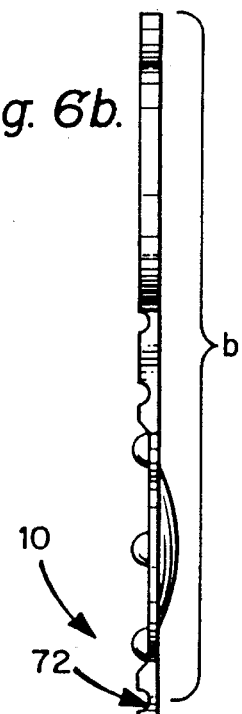
Figure 6D:
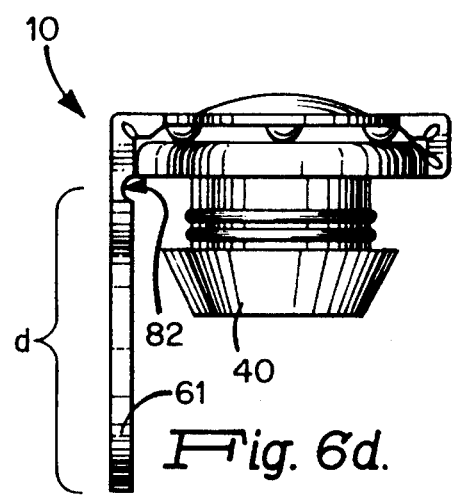
Figure 6E:
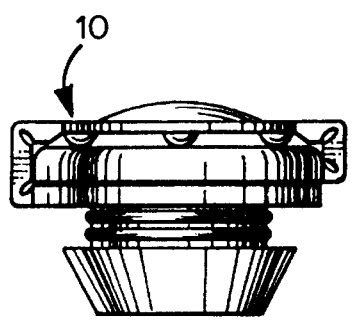

The assembly steps will now be described with reference to FIGS. 6(a)–6(e). With reference to FIGS. 6(a) and 6(b), arm "a" is folded approximately 90° with the aid of folding groove 71. Arm "b" of FIG. 6(b) is them folded approximately 90° with the aid of groove 72. As seen in FIG. 6(c), after the second folding step, the nubs 52 contact the surface 31 of main body 20. Arm "c" of FIG. 6(c), with the aid or folding groove 81, is folded approximately 90° into the position shown in FIG. 6(d). Arm "d" of FIG. 6(d) is then folded again and the tapered end 40 of main body is inserted through opening 61 into securing position shown in FIG. 6(e). Thereafter, the assembled vent may be inserted into a housing requiring a vent.

While particular embodiments of the present invention have been illustrated and described herein, the present invention should not be limited to such illustrations and descriptions. It should be apparent that changes and modifications may be incorporated and embodied as part of the present invention within the scope of the following claims.

I claim:

1. A vent cover comprising:
   (a) a main body portion having a gas-permeable, aqueous liquid impermeable membrane with a cross-sectional flow-through area, wherein said main body portion has upper and lower ends, said upper end having a diameter larger than a diameter of said lower end and said lower end being tapered; and
   (b) a protectively positioned diaphragm valve covering at least said cross-sectional flow area and preventing said membrane from damage caused by immersion in or impingment by aqueous liquids, said valve connected to said main body portion; and
   (c) a securing member for maintaining said diaphragm valve in protective position with respect to said membrane, said securing member being annular in shape and having an inner diameter less than that of said upper end of said main body and greater than the tapered lower end of said body.

2. A vent cover comprising:
   a) a flexible, resilient body having a through passageway;
   b) a gas-permeable, aqueous liquid-impermeable membrane traversing said passageway;
   c) a diaphragm valve covering said membrane; and
   d) an annular securing member maintaining said valve in protective position with respect to said membrane to protect said membrane from immersion in or impingement by aqueous liquid.

3. The vent cover according to claim 2, wherein said annular securing member forces said valve downwardly towards an upper surface of said body.

4. A one piece liquid vent cover comprising:
   a) a flexible, resilient body having a through passageway;
   b) a gas-permeable, aqueous liquid-impermeable membrane located within said passageway;
   c) a diaphragm valve with a circumferential edge and first and second diametrically opposed connector tabs; and
   d) securing means for maintaining said valve in protective position with respect to said membrane;
   said first tab being connected to said flexible, resilient body and said second tab being connected to said securing means.

5. The vent cover according to claim 4, wherein said body, valve and securing means are of a one piece construction.

6. The vent cover according to claim 5, wherein said membrane is comprised of polytetrafluoroethylene.

7. A method of protecting a vented housing comprising:
   (a) inserting a flexible, flowthrough vent cover having a gas-permeable, aqueous liquid impermeable membrane into a vent opening of a housing;
   (b) covering said gas-permeable, aqueous liquid-impermeable membrane with a protectively positioned diaphragm valve; and
   (c) securing said valve in protective position with an annular securing member that forces said valve downwardly toward an upper surface of said flowthrough vent.

8. A method of venting a housing comprising:
   a) providing a molded unassembled vent cover having a main body with a membrane covered passageway, a connecting valve and securing member;
   b) folding said valve into protective position over said membrane and securing it in place by folding the securing member into position to form an assembled vent cover; and
   c) inserting the assembled vent cover into a housing to be vented.

* * * * *